United States Patent
Hsu

(10) Patent No.: US 7,973,398 B2
(45) Date of Patent: Jul. 5, 2011

(54) EMBEDDED CHIP PACKAGE STRUCTURE WITH CHIP SUPPORT PROTRUDING SECTION

(75) Inventor: Shih-Ping Hsu, Hsin-Chu (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 11/798,139

(22) Filed: May 10, 2007

(65) Prior Publication Data

US 2007/0210423 A1    Sep. 13, 2007

Related U.S. Application Data

(60) Provisional application No. 60/799,681, filed on May 12, 2006.

(30) Foreign Application Priority Data

May 12, 2005   (TW) ................................ 94115339 A

(51) Int. Cl.
H01L 23/06          (2006.01)

(52) U.S. Cl. ........ 257/684; 257/700; 257/690; 257/691; 257/698; 257/E23.019

(58) Field of Classification Search .................. 257/686, 257/690, 698, 700, 737, 723, 701, 778, 784, 257/684, 691, E23.019; 174/262

See application file for complete search history.

(56) References Cited

U.S. PATENT DOCUMENTS

| | | | | |
|---|---|---|---|---|
| 4,729,061 A * | 3/1988 | Brown | ........................... | 361/719 |
| 5,432,677 A * | 7/1995 | Mowatt et al. | ................. | 361/719 |
| 2003/0134455 A1* | 7/2003 | Cheng et al. | ................... | 438/125 |
| 2004/0001324 A1* | 1/2004 | Ho et al. | ........................ | 361/761 |
| 2006/0001152 A1* | 1/2006 | Hu | ................................. | 257/707 |
| 2006/0091530 A1* | 5/2006 | Wang | ............................. | 257/712 |

* cited by examiner

Primary Examiner — Marcos D. Pizarro
Assistant Examiner — Eva Yan Montalvo
(74) Attorney, Agent, or Firm — Birch, Stewart, Kolasch & Birch, LLP

(57) ABSTRACT

An embedded chip package structure is proposed. The embedded chip package structure includes a supporting board with a protruding section, a semiconductor chip formed on the protruding section of the supporting board, a dielectric layer formed on the supporting board and the semiconductor chip, and a circuit layer formed on the dielectric layer. The circuit layer is electrically connected to electrode pads of the semiconductor chip via a plurality of conducting structures formed inside the dielectric layer such that the semiconductor chip can be electrically connected to an external element through the circuit layer. By varying the thicknesses of the protruding section, the dielectric layer and the supporting board, warpage of the package structure resulted from temperature change during the fabrication process can be prevented.

12 Claims, 3 Drawing Sheets

EMBEDDED CHIP PACKAGE STRUCTURE WITH CHIP SUPPORT PROTRUDING SECTION

This Nonprovisional application claims priority under 35 U.S.C. §119(e) on U.S. Provisional Application No(s). 60/799,681 filed on May 12, 2006 and under 35 U.S.C. §119(a) on Patent Application No(s). 094115339 filed in Taiwan, Republic of China on May 12, 2005, the entire contents of both of which are hereby incorporated by reference.

BACKGROUND OF THE INVENTION

1. Field of the Invention

The present invention relates generally to an embedded chip package structure, more particularly to an embedded chip package structure wherein an embedded semiconductor chip can be electrically connected to external circuitry directly through the package structure.

2. Description of Related Art

With rapid development of semiconductor package technology, there have been developed various kinds of package structures for semiconductor devices. To form a semiconductor device package structure, a semiconductor component such as an integrated circuit is typically mounted to and electrically connected with a package substrate or a lead frame and then encapsulated by an encapsulant. In BGA semiconductor packaging, a semiconductor component is mounted to and electrically connected to one side of a package substrate. The other side of the package substrate has an array solder balls formed through a self-alignment technology, by which electrical connection can be made to external circuitry.

Although such a package structure enables a higher pin count per unit area, it increases layout difficulty due to a limited substrate surface and prevents the package size from further being reduced, thereby adversely affecting the improvement of electrical performance of the package structure.

In addition, fabrication of chip carriers such as substrates and lead frames, and packaging processes are conventionally conducted by different processing industries, which not only complicates the fabricating process, but also easily leads to incompatible interfaces, thereby making it difficult for customers to make new function designs.

Furthermore, with increasing demand for integrated and miniaturized semiconductor packages, heat produced by a semiconductor chip is accordingly increased. If heat can not be dissipated efficiently, the lifetime and performance of the semiconductor chip can seriously be reduced.

Therefore, an embedded chip package structure is proposed. FIG. 1 shows a conventional embedded chip package structure. As shown in FIG. 1, the package structure comprises a heat spreader 12 with an opening 120; a semiconductor chip 13 with a plurality of electrode pads 130 mounted to the heat spreader 12 and received in the opening 120; a dielectric layer 14 formed on the heat spreader 12 and the semiconductor chip 13; and a circuit layer 15 formed on the dielectric layer 14, the circuit layer 15 being electrically connected to the electrode pads 130 of the semiconductor chip 13 through a plurality of conductive blind vias 150 formed inside the dielectric layer 14.

Since there exists a big difference between CTEs (Coefficient of Thermal Expansion) of the heat spreader 12 and the dielectric layer 14, different thermal stresses generated while temperature changes in fabricating processes such as substrate baking and thermal cycle processing can lead to warpage of the package structure, and even lead to layer delamination and chip crack. To overcome these drawbacks, the thickness of the heat spreader has to be increased to balance the thermal stress resulted from temperature change. However, such a method increases the volume of the package structure and also increases the fabrication cost.

Moreover, chips embedded in the above package structure are generally of same size without constructing a multi-function module. If different sizes of chips are embedded in a substrate, since electrical connecting surfaces of different chips are difficult to be flush with each other, it often leads to an uneven surface of the dielectric layer, which thus adversely affects subsequent fine circuit process.

Accordingly, there exists a strong need in the art for an embedded chip package structure to solve the drawbacks of the above-described conventional technology.

SUMMARY OF THE INVENTION

Accordingly, an objective of the present invention is to provide an embedded chip package structure which can prevent warpage of the package structure from occurring during the thermal process of the semiconductor device.

Another objective of the present invention is to provide an embedded chip package structure which can reduce thickness, weight and fabrication cost of the semiconductor device.

A further objective of the present invention is to provide an embedded chip package structure which can keep active surfaces of embedded semiconductor components flush with each other, thereby facilitating subsequent fine circuit process.

Still another objective of the present invention is to provide an embedded chip package structure integrated with a plurality of semiconductor chips so as to improve electrical performance of the electronic device.

A further objective of the present invention is to provide an embedded chip package structure which can efficiently dissipate heat generated by embedded semiconductor chips during operation.

In order to attain the objectives mentioned above and the others, an embedded chip package structure is provided according to the present invention, which comprises: a supporting board with at least one protruding section; at least a first semiconductor chip having a plurality of electrode pads mounted on the protruding section of the supporting board; a dielectric layer formed on the supporting board and the first semiconductor chip; and a circuit layer formed on the dielectric layer, wherein the circuit layer is electrically connected to the electrode pads of the semiconductor chip through a plurality of conducting structures formed inside the dielectric layer. The package structure can further comprises at least a second semiconductor chip having a plurality of electrode pads mounted on a region of the supporting board except the protruding section, the circuit layer being electrically connected to the electrode pads of the second semiconductor chip through the conducting structures inside the dielectric layer.

The first and second semiconductor chips can be of different thickness. In addition, electrically connecting surfaces of the first and second semiconductor chips can be kept flush with each other by adjusting the thickness of the protruding section.

Further, a circuit build-up structure can be formed on the circuit layer according to the practical need.

The supporting board and the protruding section formed thereon can be made of same or different materials such as metal, ceramic or high heat dissipating material, and the supporting board and the protruding section can be integrally formed.

According to the present invention, the semiconductor chips are mounted on the protruding sections of the supporting board and thus the thicknesses of the dielectric material between the protruding sections, the build-up dielectric material and the supporting board can be adjusted by the protruding sections so as to balance the thermal stress occurring to the package structure resulted from temperature change during the fabrication process, thereby preventing warpage of the package structure. Meanwhile, since the present invention does not need to increase the thickness of the whole supporting board as needed in the prior art, the final package structure can be much lighter and the fabrication cost can be reduced.

Also, the thickness of the protruding sections can be varied according to the practical need so as to keep the electrically connecting surfaces of the semiconductor chips of different thicknesses flush with each other and thus keep surface of the dielectric layer even, thereby facilitating the subsequent circuit process and increasing reliability of the fabrication process.

Moreover, the supporting board of the present invention can receive a plurality of semiconductor chips having different, same or partially same functions and thus a package structure integrated with a multi-chip module can be obtained. Such a package structure is helpful to meet current demand for multi-functional electronic products.

Further, the present invention can integrate the fabrication process of the supporting board and the packaging process so as to provide much more flexibility to customers, simplify the semiconductor fabricating process, and prevent interface compatibility between different processes.

Moreover, since the supporting board of the present invention is made of metal, ceramic or high heat dissipating material, heat generated by the semiconductor chip during operation can be efficiently dissipated through the supporting board. Thus, the lifetime of the semiconductor chip is prolonged and the reliability of the package structure is increased.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification. The present invention can also be performed or applied by other different embodiments. The details of the specification may be on the basis of different points and applications, and numerous modifications and variations can be devised without departing from the spirit of the present invention.

According to the present invention, the embedded chip package structure is mainly characterized by at least a protruding section on a supporting board, to which a semiconductor chip can be mounted. In following embodiments, the supporting board to be described comprises two protruding sections. But those skilled in the art will understand the number of protruding sections is not limited thereto.

Figure 1:
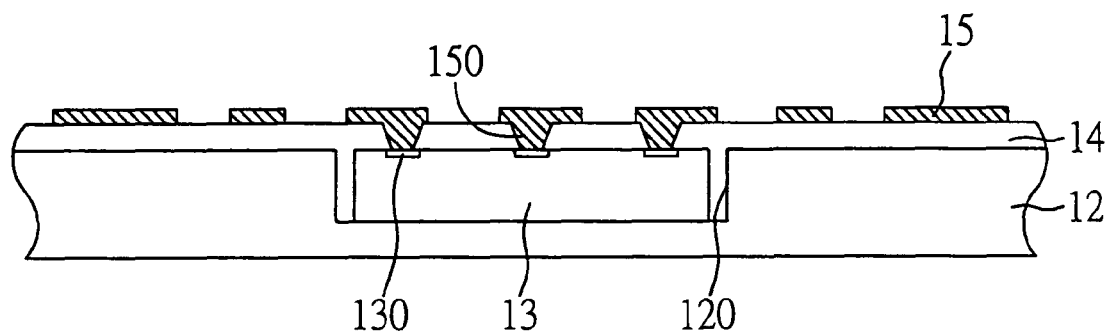
FIG. 1 is a conventional semiconductor chip package structure.
Figure 2A:
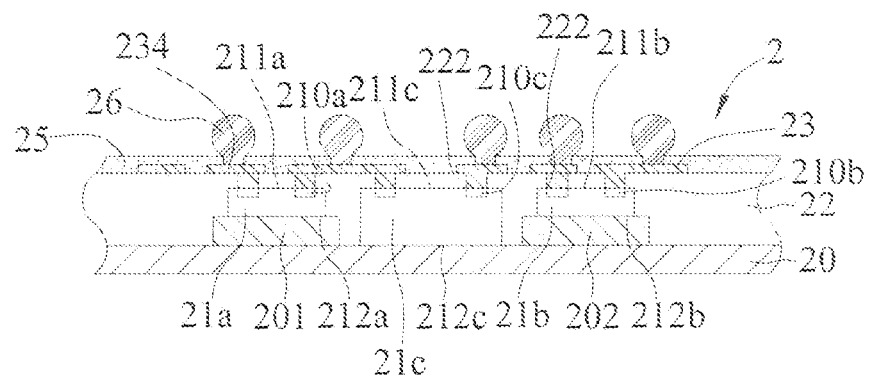
FIG. 2A is a sectional diagram of an embedded chip package structure according to a first embodiment of the present invention.

FIG. 2A is a sectional view of an embedded chip package structure according to a preferred embodiment of the present invention. As shown in FIG. 2A, the embedded chip package structure 2 comprises a supporting board 20 having protruding sections 201, 202; semiconductor chips 21a and 21b respectively mounted on the protruding sections 201 and 202 of the supporting board 20; a dielectric layer 22 formed on the supporting board 20 and the semiconductor chips 21a and 21b; and a circuit layer 23 formed on the dielectric layer 22 and electrically connected to the semiconductor chips 21a and 21b.

The package structure 2 further comprises at least a semiconductor chip 21c mounted on a region of the supporting board 20 except the protruding sections 201 and 202. The circuit layer 23 is further electrically connected to the semiconductor chip 21c.

The supporting board 20 and the protruding sections 201, 202 can be made of same or different materials such as metal, ceramic or high heat dissipating material.

In addition, the supporting board 20 and the protruding sections 201, 202 can be integrally formed of metal, ceramic or high heat dissipating material.

The semiconductor chip 21a has an active surface 211a with a plurality of electrode pads 210a formed thereon, and a non-active surface 212a opposite to the active surface 211a. Similarly, the semiconductor chip 21b has an active surface 211b with a plurality of electrode pads 210b formed thereon, and a non-active surface 212b opposite to the active surface 211b. The semiconductor chips 21a and 21b are respectively mounted on the protruding sections 201 and 202 via their non-active surfaces 212a and 212b through an adhesive layer (not shown). The semiconductor chip 21c has an active surface 211c with a plurality of electrode pads 210c formed thereon and a non-active surface 212c opposite to the active surface 211c. The semiconductor chip 21c is directly mounted on the supporting board 20 via its non-active surface 212c through an adhesive layer (not shown). Each of the semiconductor chips 21a, 21b, and 21c described above can be either an active chip or a passive chip. Also, the semiconductor chips 21a, 21b, and 21c can be of different thickness. The heights of the protruding sections 201 and 202 can be varied according to the different thicknesses of the semiconductor chips 21a, 21b, and 21c so as to keep the active surfaces 211a, 211b and 211c flush with each other and thus facilitate a subsequent fine circuit process on the semiconductor chips for further electrical connection.

The dielectric layer 22 is formed on the supporting board 20 and the semiconductor chips 21a, 21b and 21c and completely filled in the gaps between the adjacent protruding sections. The dielectric layer 22 may be made of organic resin material, which can be photosensitive or non-photosensitive organic resin or epoxy resin comprising glass fiber such as ABF (Ajinomoto Build-up Film), BCB (Benzocyclobuthene), LCP (Liquid Crystal Polymer), PI (Poly-imide), PPE (Poly(phenylene ether)), PTFE (Poly(tetra-fluoroethylene)), FR4, FR5, BT (Bismaleimide Triazine) and aramide.

The circuit layer 23 is formed on the dielectric layer 22 and electrically connected to the electrode pads 210a, 210b and 210c of the semiconductor chips 21a, 21b and 21c through a plurality of conducting structures 222 formed inside the dielectric layer 22. The conducting structures 222 can be such as conductive blind vias or conductive bumps. The circuit layer 23A has a plurality of electrically connecting pads 234 formed on a part of outer surface thereof. The circuit layer is further covered by a solder mask layer 25, which has a plurality of openings to expose the electrically connecting pads 234 of the circuit layer 23A such that a plurality of conductive components 26 can be mounted to the electrically connecting pads 234. Thus, a package structure integrated with a multi-chip module can be formed. Since the fabrication method of the circuit layer 23 is already known in the art, detailed description of it is omitted.

According to the present invention, the semiconductor chips are mounted on the protruding sections of the supporting board and thus the thickness of the dielectric layer between the protruding sections can be adjusted by the protruding sections so as to balance the thermal stress occurring to the package structure resulted from temperature change during the fabrication process, thereby preventing warpage of the package structure. In addition, the protruding sections can provide a preferred supporting effect to the semiconductor chips mounted thereon and thus chip crack resulted from warpage of the package structure can be avoided.

In addition, since it is not necessary to increase the thickness of the whole supporting board in the present invention, as needed in the prior art, the final package structure can be made much lighter. Meanwhile, the thickness of the protruding sections can be varied according to the practical need so as to keep the electrically connecting surfaces of the semiconductor chips of different thicknesses flush with each other and thus keep surface of the dielectric layer even, thereby facilitating the subsequent circuit process and increasing fabrication reliability.

In the present invention, a circuit build-up process can further be performed on the dielectric layer 22 and the circuit layer 23 of the package structure according to the practical need.

Figure 2B:
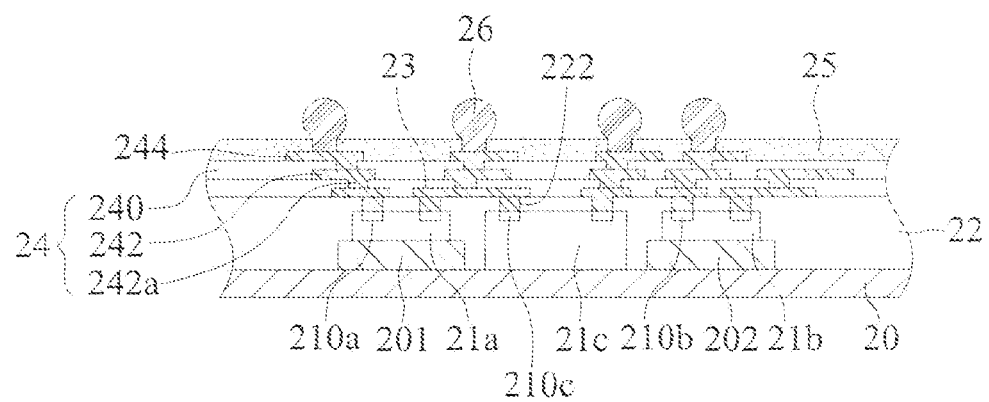
FIG. 2B is a sectional view of an embedded chip package structure after a circuit build-up processing is performed on the package structure of the first embodiment of the present invention.

FIG. 2B shows an embedded chip package structure formed after performing a circuit build-up processing on the dielectric layer 22 and the circuit layer 23 of FIG. 2A. As shown in FIG. 2B, a circuit build-up structure 24 is formed on the dielectric layer 22 and the circuit layer 23.

The circuit build-up structure 24 comprises a dielectric layer 240, a circuit layer 242 stacked on the dielectric layer 240, and a plurality of conductive blind vias 242a in the dielectric layer 240 for electrically connecting the circuit layers 242 and 23 under the dielectric layer 240.

In addition, a plurality of electrically connecting pads 244 is formed on an outer surface of the circuit build-up structure and a solder mask layer 25 is formed on the outermost circuit layer. The solder mask layer 25 comprises a plurality of openings to expose the electrically connecting pads 244, to which a plurality of conductive components 26 such as solder balls, conductive traces and solder traces can be mounted. As a result, the semiconductor chips 21a, 21b and 21c of the package structure can be electrically connected to an external electronic device through the electrode pads 210a, 210b and 210c, the circuit layer 23, the circuit build-up structure 24 and the conductive components 26. It should be noted that the circuit build-up structure is not limited to the present embodiment, the number of build-up layers can be increased according to the need.

Figure 3:
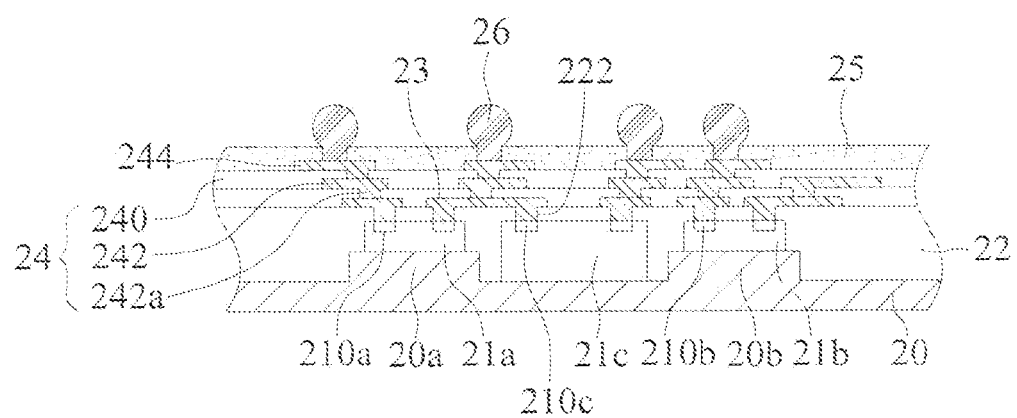
FIG. 3 is a sectional diagram of an embedded chip package structure according to a second embodiment of the present invention.

FIG. 3 is a sectional diagram of an embedded chip package structure according to another embodiment of the present invention. Different from the above embodiment, protruding sections of the present embodiment are integrally formed with the supporting board. As shown in FIG. 3, protruding sections 20a and 20b are formed by performing an electroforming or etching process on the supporting board 20. Thereafter, semiconductor chips 21a and 21b can respectively be mounted on the protruding sections 20a and 20b and the active surfaces 211a, 211b and 211c of the semiconductor chips 21a, 21b and 21c are kept flush with each other.

According to the present invention, the semiconductor chips are mounted on the protruding sections of the supporting board and thus the thicknesses of the dielectric material between the protruding sections, the build-up dielectric material and the supporting board can be adjusted by the protruding sections so as to balance the thermal stress occurring to the package structure resulted from temperature change during the fabrication process, thereby preventing warpage of the package structure. Meanwhile, since the present invention does not need to increase the thickness of the whole supporting board as needed in the prior art, the final package structure can be much lighter and the fabrication cost can be reduced.

Also, the thickness of the protruding sections can be varied according to the practical need so as to keep the electrically connecting surfaces of the semiconductor chips of different thicknesses flush with each other and thus keep surface of the dielectric layer even, thereby facilitating the subsequent circuit process and increasing reliability of the fabrication process.

Moreover, the supporting board of the present invention can receive a plurality of semiconductor chips having different, same or partially same functions and thus a package structure integrated with a multi-chip module can be obtained. Such a package structure is helpful to meet current demand for multi-functional electronic products.

Further, the present invention can integrate the fabrication process of the supporting board and the packaging process so as to provide much more flexibility to customers, simplify the semiconductor fabricating process, and prevent interface compatibility between different processes.

Moreover, since the supporting board of the present invention is made of metal, ceramic or high heat dissipating material, heat generated by the semiconductor chip during operation can be efficiently dissipated through the supporting board. Thus, the lifetime of the semiconductor chip is prolonged and the reliability of the package structure is increased.

The above-described descriptions of the detailed embodiments are only to illustrate the preferred implementation according to the present invention, and it is not to limit the scope of the present invention, i.e., other changes still can be implemented in the present invention. For example, for those circuit boards that have very similar component layout, sometimes a single masking board may be used by simply blocking those unwanted openings. Accordingly, all modifications and variations completed by those with ordinary skill in the art should fall within the scope of present invention defined by the appended claims.

What is claimed is:

1. An embedded chip package structure, comprising:
   a supporting board with at least one protruding section;
   at least a first semiconductor chip having a plurality of electrode pads and mounted on a surface of the protruding section of the supporting board, wherein the surface of the protruding section is flat and free of any cavity;
   at least a second semiconductor chip having a plurality of electrode pads mounted on a region of the supporting board except the protruding section, wherein the first and second semiconductor chips are slightly different in thickness, and the height of the protruding section of the supporting board can be varied according to the thicknesses of the first and second semiconductor chips so as to keep electrically connecting surfaces of the first and second semiconductor chips flush with each other;

a dielectric layer formed on the supporting board and the first semiconductor chip and being in contact with the supporting board, the protruding section and the first and second semiconductor chips, wherein the dielectric layer covers the protruding section; and a circuit layer formed on the dielectric layer, wherein the circuit layer is electrically connected to the electrode pads of the first and second semiconductor chips through a plurality of conducting structures formed inside the dielectric layer.

2. The embedded chip package structure of claim 1, wherein a circuit build-up structure is further formed on and electrically connected with the circuit layer.

3. The embedded chip package structure of claim 2, wherein the circuit build-up structure comprises a dielectric layer, a circuit layer stacked on the dielectric layer, and conductive blind vias in the dielectric layer for electrically connecting the circuit layers above and below the dielectric layer.

4. The embedded chip package structure of claim 2, wherein a plurality of conductive components are mounted to outer surface of the circuit build-up structure, which allows the semiconductor chip to be electrically connected to an external electronic device.

5. The embedded chip package structure of claim 1, wherein the supporting board is made of one of the group consisting of metal, ceramic and high heat dissipating material.

6. The embedded chip package structure of claim 1, wherein the protruding section is made of one of the group consisting of metal, ceramic and high heat dissipating material.

7. The embedded chip package structure of claim 1, wherein the supporting board and the protruding section are made of different materials.

8. The embedded chip package structure of claim 1, wherein the supporting board and the protruding section are made of same material.

9. The embedded chip package structure of claim 1, wherein the protruding section is externally mounted to the supporting board.

10. The embedded chip package structure of claim 1, wherein the protruding section is formed integrally with the supporting board.

11. The embedded chip package structure of claim 1, wherein the first semiconductor chip is one of an active chip and a passive chip.

12. The embedded chip package structure of claim 1, wherein the second semiconductor chip is one of an active chip and a passive chip.

* * * * *